United States Patent
Chen et al.

(10) Patent No.: US 8,993,711 B2
(45) Date of Patent: Mar. 31, 2015

(54) SEMICONDUCTING POLYMERS AND OPTOELECTRONIC DEVICES INCORPORATING SAME

(75) Inventors: Ming-Chou Chen, Jhongli (TW); Antonio Facchetti, Chicago, IL (US); Jordan Quinn, Skokie, IL (US); Jennifer E. Brown, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 630 days.

(21) Appl. No.: 13/253,218

(22) Filed: Oct. 5, 2011

(65) Prior Publication Data

US 2012/0085993 A1      Apr. 12, 2012

Related U.S. Application Data

(60) Provisional application No. 61/390,402, filed on Oct. 6, 2010.

(51) Int. Cl.
| | | |
|---|---|---|
| *C08G 75/00* | (2006.01) | |
| *H01L 51/00* | (2006.01) | |
| *C08G 61/12* | (2006.01) | |
| *H01L 51/05* | (2006.01) | |
| *H01L 51/50* | (2006.01) | |

(52) U.S. Cl.
CPC ......... *H01L 51/0036* (2013.01); *H01L 51/0558* (2013.01); *H01L 51/5012* (2013.01); *Y02E 10/549* (2013.01); *C08G 61/123* (2013.01); *C08G 61/126* (2013.01); *C08G 2261/145* (2013.01); *C08G 2261/3243* (2013.01); *C08G 2261/3246* (2013.01); *C08G 2261/364* (2013.01); *C08G 2261/414* (2013.01)

USPC ............................. 528/377; 528/380; 528/378

(58) Field of Classification Search
USPC ........................................ 528/377, 378, 380
See application file for complete search history.

(56) References Cited

U.S. PATENT DOCUMENTS

| | | | |
|---|---|---|---|
| 7,368,510 B2 | 5/2008 | Lee et al. | 525/355 |
| 2002/0060321 A1* | 5/2002 | Kazlas et al. | 257/66 |
| 2007/0265418 A1* | 11/2007 | He | 528/226 |
| 2010/0078074 A1* | 4/2010 | Yang et al. | 136/263 |
| 2010/0252112 A1 | 10/2010 | Watson | 136/263 |
| 2011/0108813 A1 | 5/2011 | Kohiro et al. | 257/40 |
| 2013/0168642 A1 | 7/2013 | Chen et al. | 257/40 |

FOREIGN PATENT DOCUMENTS

| | | |
|---|---|---|
| KR | 2010086197 | 7/2010 |
| WO | 94/02530 | 2/1994 |

OTHER PUBLICATIONS

Ng et al. Macromolecules 1999, 32, 5313-5320.*
Ng. et al., Synthetic Metals, 90 (1997), 25-30.*

* cited by examiner

*Primary Examiner* — Shane Fang
(74) *Attorney, Agent, or Firm* — Karen K. Chan

(57) ABSTRACT

The present invention relates to certain polymeric compounds based upon a head-to-head (H—H) alkylthio-substituted bithiophene repeating units (e.g., 3,3'-bis(tetradecylthio)-2, 2'-bithiophene). Such compounds can exhibit desirable electronic properties and possess processing advantages including solution-processability and/or good stability at ambient conditions.

7 Claims, 9 Drawing Sheets

US 8,993,711 B2

SEMICONDUCTING POLYMERS AND OPTOELECTRONIC DEVICES INCORPORATING SAME

REFERENCE TO RELATED APPLICATIONS

This application claims priority to and the benefit of U.S. Provisional Application No. 61/390,402, filed on Oct. 6, 2010, the entire contents of which are incorporated by reference herein.

BACKGROUND

Organic optoelectronic devices such as organic photovoltaic (OPV) devices, organic field effect transistors (OFETs), organic light emitting transistors (OLETs), organic light emitting diodes (OLEDs), printable circuits, electrochemical capacitors, and sensors are built upon organic semiconductors as their active components. To enable high device efficiencies such as large charge carrier mobilities (pt) needed for transistor/circuit operations, or efficient exciton formation/splitting that is necessary for OLED/OPV operations, it is desirable that both p-type and n-type organic semiconductor materials are available. Furthermore, these organic semiconductor-based devices should exhibit satisfactory stability in ambient conditions and should be processable in a cost-effective manner. Although certain polymers have been reported with good carrier mobility, good light harvesting, and/or good light emission properties; very few in fact exhibit the combination of high device performance characteristics with excellent processability and stability in ambient conditions.

Accordingly, the art desires new organic semiconductor materials, particularly those that can have good device performance characteristics, processing properties, and stability in ambient conditions.

SUMMARY

In light of the foregoing, the present teachings provide organic semiconductor materials that are prepared from polymeric compounds based upon a head-to-head alkylthio-substituted bithiophene repeating unit. Also provided are associated devices and related methods for the preparation and use of these compounds. The present polymeric compounds can exhibit desirable optoelectronic properties such as good charge transport and/or optical absorption characteristics in ambient conditions. The present polymeric compounds also can provide desirable processing properties including chemical stability, large solubility in common solvents, low-temperature processability, and/or processing versatility (e.g., via various solution processes). As a result, organic semiconductor-based devices such as organic thin film transistors (e.g., OFETs and OLETs) can be fabricated efficiently using the organic semiconductor materials described herein and exhibit good device performance in ambient conditions, for example, demonstrating one or more of large charge carrier mobilities, low threshold voltages, and high current on-off ratios. Similarly, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
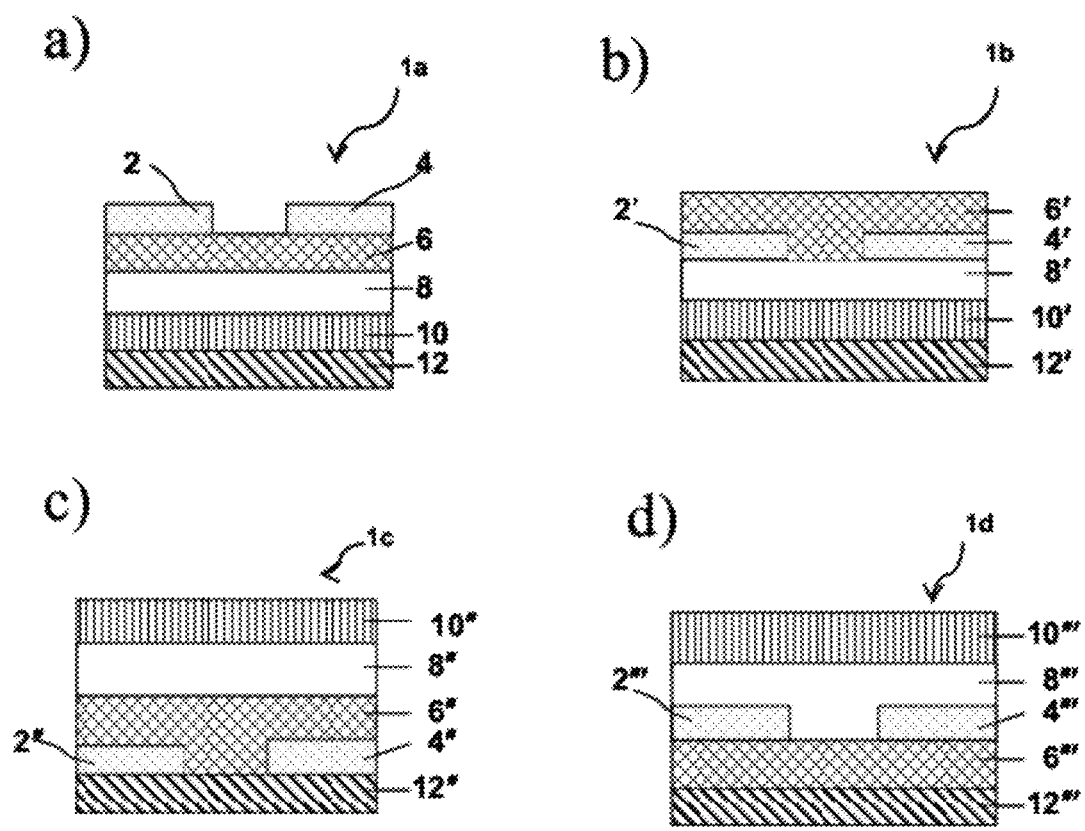
FIG. 1 illustrates four different configurations of thin film transistors: bottom-gate top contact (top left), bottom-gate bottom-contact (top right), top-gate bottom-contact (bottom left), and top-gate top-contact (bottom right); each of which can be used to incorporate compounds of the present teachings.

The present teachings provide polymeric compounds that are based upon a head-to-head alkylthio-substituted bithiophene repeating units. Compounds of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present compounds can possess certain processing advantages such as solution-processability and/or good stability (for example, air stability) in ambient conditions. The compounds of the present teachings can be used to prepare either p-type or n-type semiconductor materials, which in turn can be used to fabricate various organic electronic, optical, and optoelectronic articles, structures and devices, including field-effect transistors, unipolar circuitries, complementary circuitries, photovoltaic devices, and light emitting devices.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from the melt or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

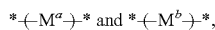

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

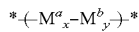

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight $M_w$ depending on the measuring technique(s)).

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

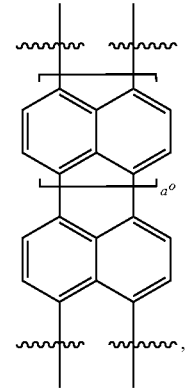

where $a^o$ can be an integer in the range of 0-3; coronenes (or analogs thereof containing one or more heteroatoms) having the formula:

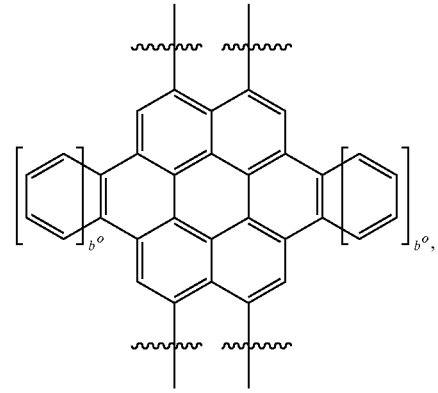

where $b^o$ can be an integer in the range of 0-3; and linear acenes (or analogs thereof containing one or more heteroatoms) having the formula:

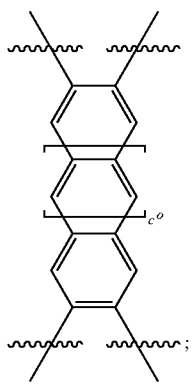

where $c^o$ can be an integer in the range of 0-4. The fused ring moiety can be optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

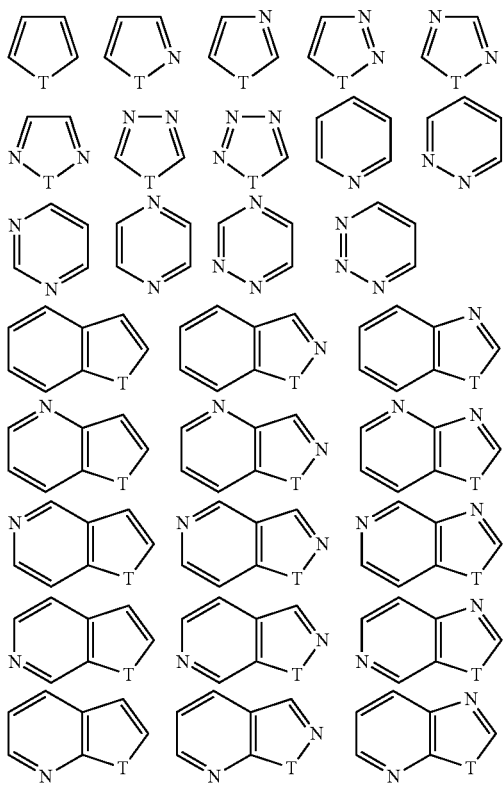

where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group), a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), $-NO_2$, —CN, —NC, $-S(R^0)_2{}^+$, $-N(R^0)_3{}^+$, $-SO_3H$, $-SO_2R^0$, $-SO_3R^0$, $-SO_2NHR^0$, $-SO_2N(R^0)_2$, —COOH, $-COR^0$, $-COOR^0$, $-CONHR^0$, $-CON(R^0)_2$, $C_{1-40}$ haloalkyl groups, $C_{6-14}$ aryl groups, and 5-14 membered electron-poor heteroaryl groups; where $R^0$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, $-NO_2$, —CN, —NC, $-S(R^0)_2{}^+$, $-N(R^0)_3{}^+$, $-SO_3H$, $-SO_2R^0$, $-SO_3R^0$, $-SO_2NHR^0$, $-SO_2N(R^0)_2$, —COOH, $-COR^0$, $-COOR^0$, $-CONHR^0$, and $-CON(R^0)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, $-OR^0$, $-NH_2$, $-NHR^0$, $-N(R^0)_2$, and 5-14 membered electron-rich heteroaryl groups, where $R^0$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine.

Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings provide polymeric compounds that can be used to prepare organic semiconductor materials. More specifically, the present polymeric compounds are based upon a head-to-head alkylthio-substituted bithiophene repeating unit of formula (I):

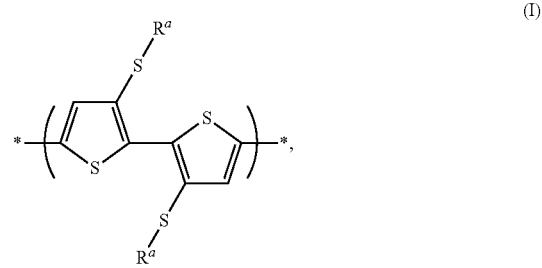

wherein $R^a$, at each occurrence, independently can be a $C_{1-40}$ alkyl group or other similar organic groups such as a $C_{2-40}$ alkenyl group, a $C_{2-40}$ alkynyl group, or a $C_{1-40}$ haloalkyl group, where optionally, one or more non-adjacent $CH_2$ groups in the $C_{1-40}$ alkyl group, the $C_{2-40}$ alkenyl group, the $C_{2-40}$ alkynyl group, or the $C_{1-40}$ haloalkyl group independently can be replaced by —O— or —S—, provided that no two oxygen or sulfur atoms are linked directly to one another.

The present polymeric compounds can include as few as two repeating units of formula (I). However, in most embodiments, the present polymeric compounds typically have a degree of polymerization (n) of 3-5,000, preferably, a degree of polymerization (n) of at least 4 and up to about 5,000, at least 5 and up to about 5,000, at least 6 and up to about 5,000, at least 8 and up to about 5,000, or at least 10 and up to about 5,000. Accordingly, the present polymers can have an average molecular weight in the range of about 3,000 to about 300,000.

In various embodiments, each $R^a$ independently can be a linear $C_{1-40}$ alkyl group, a linear $C_{1-40}$ haloalkyl group, a branched $C_{3-40}$ alkyl group, or a branched $C_{3-40}$ haloalkyl group. For example, the branched $C_{3-40}$ alkyl group or the branched $C_{3-40}$ haloalkyl group independently can be selected from

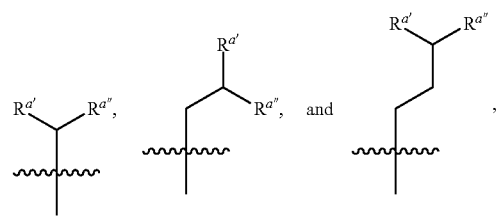

where $R^{a'}$ and $R^{a''}$, independently can be a linear $C_{1-20}$ alkyl group or a linear $C_{1-20}$ haloalkyl group.

In certain embodiments, the two $R^a$ groups in the repeating unit of formula (I) can be the same and selected from an alkyl or haloalkyl group having at least 6 carbon atoms. For example, each $R^a$ can be selected from a $C_{6-40}$ alkyl group and a $C_{6-40}$ haloalkyl group. In particular embodiments, each $R^a$ can be a linear alkyl group having at least 6, 8, 10, 12, or 14 carbon atoms. For example, the present polymers can be based upon a repeating unit of formula (I), where $R^a$ is $C_{14}H_{29}$.

While homopolymers of repeating units of formula (I) are within the scope of the present teachings, the present polymers typically include at least one other repeating unit that does not include a 3,3-bis(alkylthio)-2,2-bithiophene. In certain embodiments, the other repeating unit can include one or more unsubstituted or differently substituted thienyl groups. For example, the present polymers can include at least one other repeating unit that includes one, two, three or four 2,5-thienyl groups, where each of the thienyl groups optionally can be substituted with 1-2 $R^b$ groups at the 3 and/or 4 position(s), where $R^b$, at each occurrence, independently can be selected from F, Cl, CN, a $C_{1-40}$ alkyl group, a $C_{2-40}$ alkenyl group, a $C_{2-40}$ alkynyl group, a $C_{1-40}$ haloalkyl group, an —O—$C_{1-40}$ alkyl group, an —O—$C_{2-40}$ alkenyl group, an —O—$C_{2-40}$ alkynyl group, and an —O—$C_{1-40}$ haloalkyl group.

In some embodiments, the present polymers can include a second repeating unit including one or more unsubstituted thienyl groups. For example, in addition to the repeating unit of formula (I), the present polymers can include a repeating unit of formula (II) or (III):

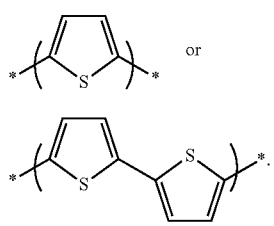

(II)

(III)

In some embodiments, the present polymers can include a repeating unit that includes at least one substituted thienyl group, where the substituent is not an alkylthio group. When such other repeating units include two or more substituted thienyl groups, the substitution pattern can be regioregular. For example, the other repeating unit can include a head-to-head substituted bithiophene (i.e., a 3,3'-bis(substituted)-2,2'-bithiophene), where the substituents can be selected from F, Cl, CN, a $C_{1-40}$ alkyl group, a $C_{2-40}$ alkenyl group, a $C_{2-40}$ alkynyl group, a $C_{1-40}$ haloalkyl group, an —O—$C_{1-40}$ alkyl group, an —O—$C_{2-40}$ alkenyl group, an —O—$C_{2-40}$ alkynyl group, and an —O—$C_{1-40}$ haloalkyl group. In certain embodiments, the other repeating unit can include a quaterthiophene including at least one substituted thienyl groups. For example, the terminal thienyl groups in the quaterthiophene can be substituted at the 3-position (i.e., a 5,5'-bis(3-(substituted)thiophen-2-yl)-2,2'-bithiophene), where the substituents can be selected from F, Cl, CN, a $C_{1-40}$ alkyl group, a $C_{2-40}$ alkenyl group, a $C_{2-40}$ alkynyl group, a $C_{1-40}$ haloalkyl group, an —O—$C_{1-40}$ alkyl group, an —O—$C_{2-40}$ alkenyl group, an —O—$C_{2-40}$ alkynyl group, and an —O—$C_{1-40}$ haloalkyl group. In particular embodiments, the substituents can be a $C_{1-40}$ alkyl group or an —O—$C_{1-40}$ alkyl group. Substituents comprising long aliphatic chains (for example, $C_{6-40}$ alkyl group or an —O—$C_{6-40}$ alkyl group) can be used to increase the solubility of the repeating unit and the polymer as a whole. For example, in addition to the repeating unit of formula (I), the present polymers can include a repeating unit of formula (IV) or (V):

(IV)

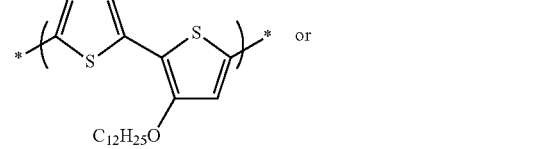

(V)

In some embodiments, the present polymers can include at least one other repeating unit that includes an optionally substituted polycyclic 8-14 membered heteroaryl group. The substituent(s), if present, can be selected from F, Cl, CN, a $C_{1-40}$ alkyl group, a $C_{2-40}$ alkenyl group, a $C_{2-40}$ alkynyl group, a $C_{1-40}$ haloalkyl group, an —O—$C_{1-40}$ alkyl group, an —O—$C_{2-40}$ alkenyl group, an —O—$C_{2-40}$ alkynyl group, an —O—$C_{1-40}$ haloalkyl group, an —S—$C_{1-40}$ alkyl group, an —S—$C_{2-40}$ alkenyl group, an —S—$C_{2-40}$ alkynyl group, and an —S—$C_{1-40}$ haloalkyl group. For example, the optionally substituted polycyclic 8-14 membered heteroaryl group can be electron-rich and include at least one sulfur atom. In certain embodiments, the optionally substituted polycyclic 8-14 membered heteroaryl group can include fused thienyl groups. For example, the other repeating unit can include an optionally substituted thieno[3,2-b]thiophene, an optionally substituted dithieno[3,2-b;2',3'-d]thiophene, or an optionally substituted 2,6-tetrathienoacene. Accordingly, in addition to the repeating unit of formula (I), the present polymers can include a repeating unit of formula (VI), (VII) or (VIII):

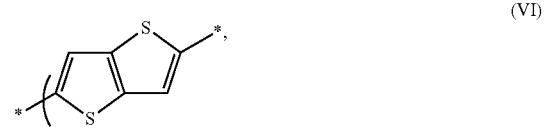

(VI)

(VII)

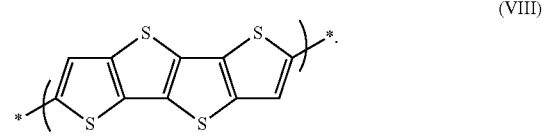

(VIII)

As with repeating units that include at least one substituted thienyl groups, fused thienyl groups such as those of formulae (VI), (VII) and (VIII) can be substituted optionally with one or more electron-withdrawing groups such as F, Cl, and CN; and/or one or more electron-donating groups such as a $C_{1-40}$ alkyl group, a $C_{2-40}$ alkenyl group, a $C_{2-40}$ alkynyl group, a $C_{1-40}$ haloalkyl group, an —O—$C_{1-40}$ alkyl group, an —O—$C_{2-40}$ alkenyl group, an —O—$C_{2-40}$ alkynyl group, an —O—$C_{1-40}$ haloalkyl group, an —S—$C_{1-40}$ alkyl group, an —S—$C_{2-40}$ alkenyl group, an —S—$C_{2-40}$ alkynyl group, and an —S—$C_{1-40}$ haloalkyl group. Substituents comprising long aliphatic chains (for example, $C_{6-40}$ alkyl group or an —O—$C_{6-40}$ alkyl group) also can be used to increase the solubility of the repeating unit and the polymer as a whole.

In certain embodiments, the optionally substituted polycyclic 8-14 membered heteroaryl group can include an optionally substituted benzo-fused group that includes at least one sulfur atom. For example, the other repeating unit can include an optionally substituted benzo[1,2-b:4,5-b']dithiophene, which is illustrated by a repeating unit of formula (IX):

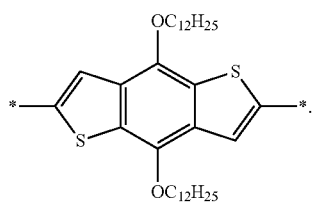

(IX)

In some embodiments, the optionally substituted polycyclic 8-14 membered heteroaryl group can be electron-poor and include at least one nitrogen atom. For example, the other repeating unit can include an optionally substituted benzo[c][1,2,5]thiadiazole, which is illustrated by a repeating unit of formula (X):

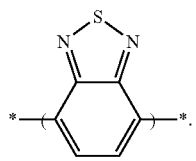

(X)

In some embodiments, the present polymers can include at least one other repeating unit, where such other repeating unit can be selected from a vinyl group optionally substituted with 1-2 electron withdrawing groups or 1-2 electron donating groups, a carbonyl group, a 5-membered heteroaryl group other than thienyl group and optionally substituted with 1-2 electron withdrawing groups or 1-2 electron donating groups, a phenyl group optionally substituted with 1-4 electron-withdrawing groups or 1-4 electron-donating groups, a naphthalenyl group optionally substituted with 1-6 electron-withdrawing groups or 1-6 electron-donating groups, and a perylenyl group optionally substituted with 1-6 electron-withdrawing groups or 1-6 electron-donating groups. Examples of electron-withdrawing groups include F, Cl, CN, and $NO_2$. Examples of electron-donating groups include alkyl groups, alkoxy groups, and alkylthio groups.

To illustrate, the other repeating unit can be selected from:

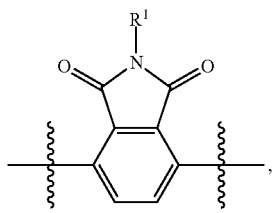

-continued

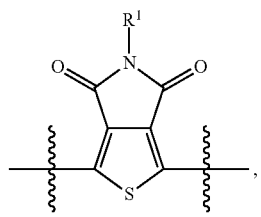

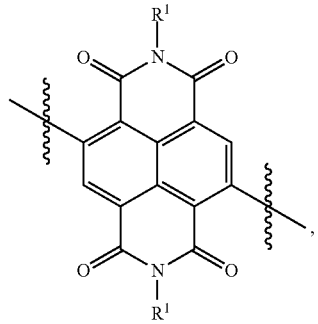

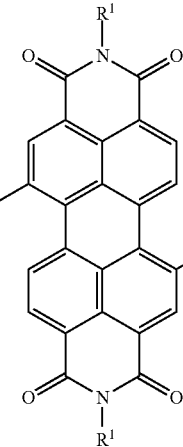

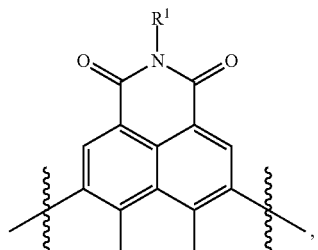

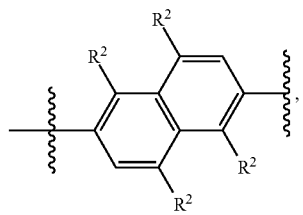

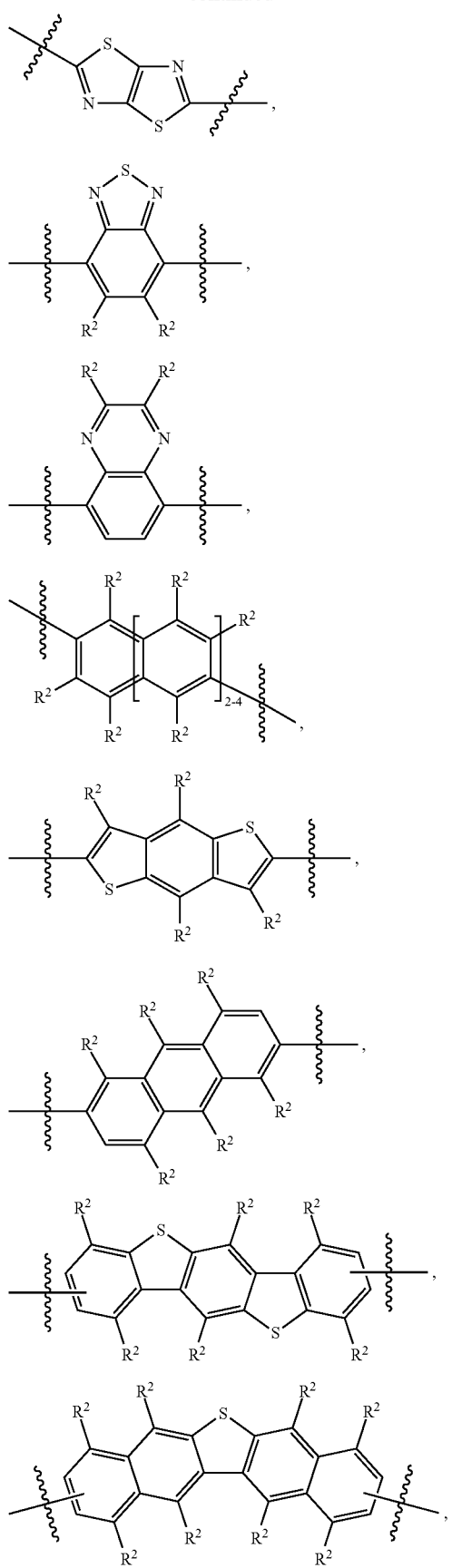
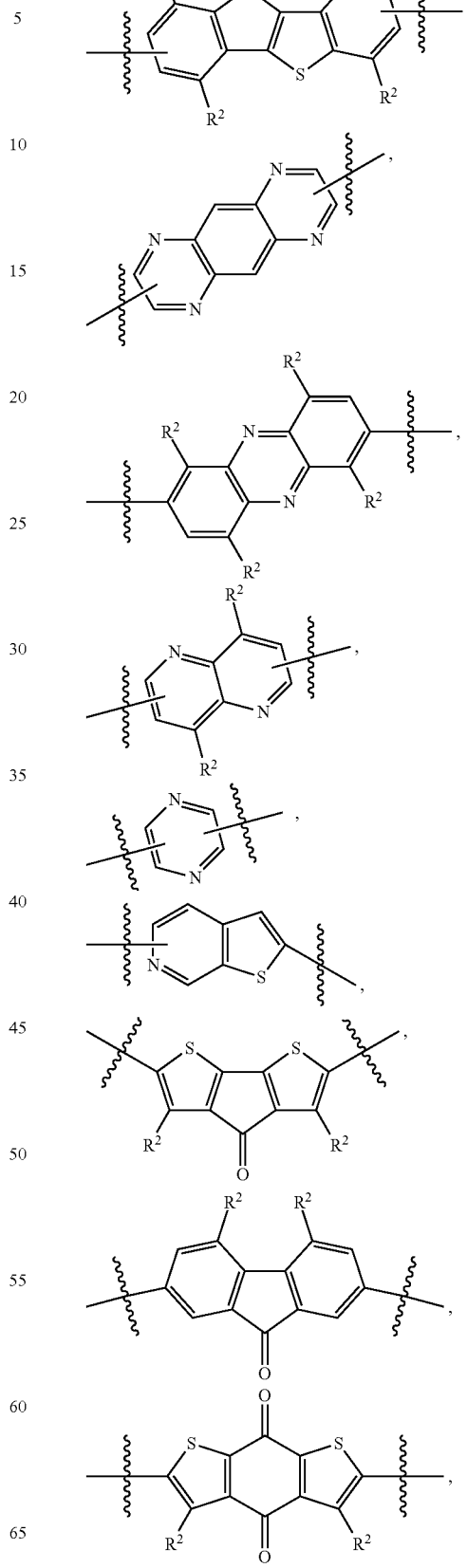

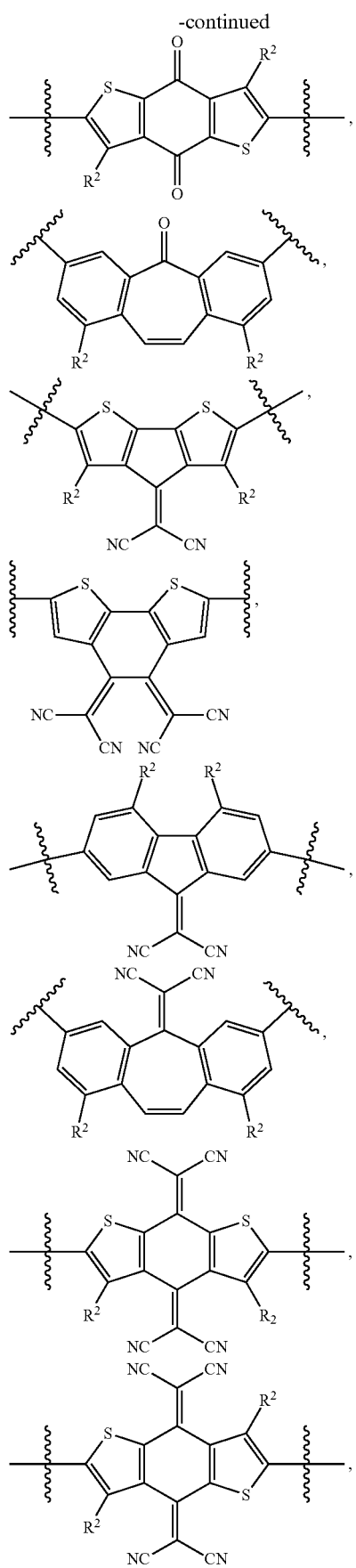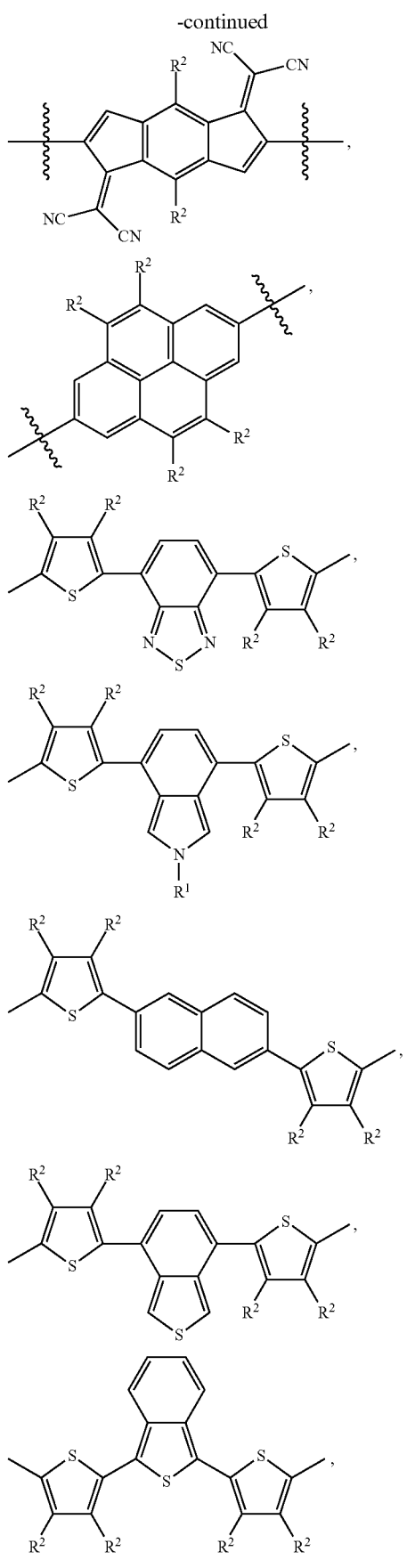

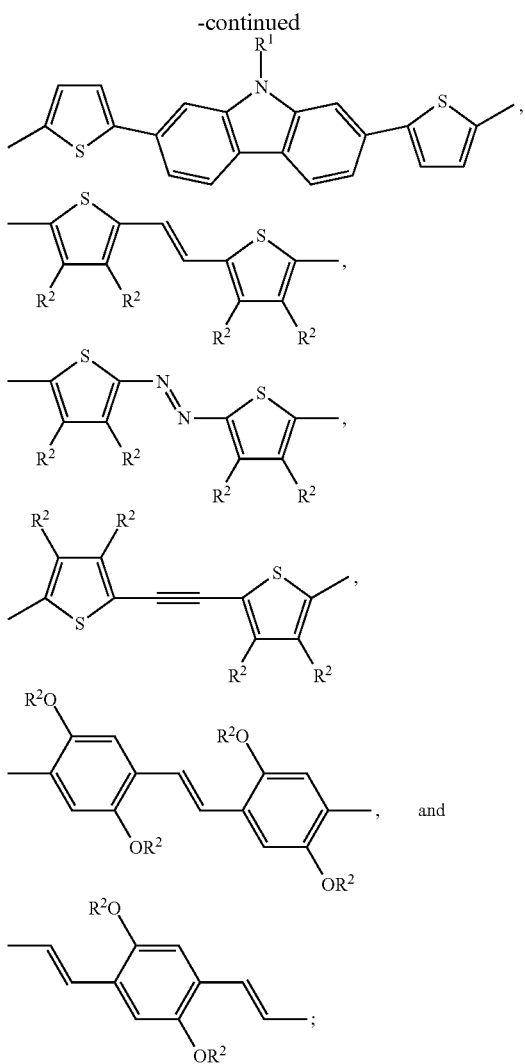

wherein $R^1$ can be selected from a $C_{1-40}$ alkyl group, a $C_{2-40}$ alkenyl group, and a $C_{1-40}$ haloalkyl group; and $R^2$, at each occurrence, independently can be selected from H, an electron-withdrawing group, and an electron donating group. Examples of electron-withdrawing groups include F, Cl, CN, and $NO_2$. Examples of electron-donating groups include alkyl groups, alkoxy groups, and alkylthio groups. In various embodiments, substituents comprising long aliphatic chains (for example, $C_{6-40}$ alkyl group or an —O—$C_{6-40}$ alkyl group) can be used to increase the solubility of the repeating unit and the polymer as a whole.

In embodiments where the present polymers include the repeating unit of formula (I) and at least one other repeating unit, the manner in which the repeating unit of formula (I) and the other repeating unit(s) is repeated can be alternating, random, regiorandom, regioregular, or in blocks. In certain embodiments, the repeating unit of formula (I) can alternate with the other repeating unit(s). In alternative embodiments, polymers according to the present teachings can be random copolymers.

Compounds of the present teachings can be prepared according to procedures analogous to those described in the Examples. In particular, Stille coupling can be used to prepare co-polymeric compounds according to the present teachings.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1H$ or $^{13}C$), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when the carrier mobility or the oxidation potential of the compound is maintained at about its initial measurement when the compound is exposed to ambient conditions, for example, air, ambient temperature, and humidity, over a period of time. For example, a compound according to the present teachings can be described as ambient stable if its carrier mobility or oxidation potential does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Compounds of the present teachings can be used to prepare semiconductor materials (e.g., compositions and composites), which in turn can be used to fabricate various articles of manufacture, structures, and devices. In various embodiments, semiconductor materials incorporating one or more compounds of the present teachings can exhibit p-type semiconductor activity, n-type semiconductor activity, or ambipolar activity, and optionally light absorption, and/or light emission properties.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the compounds disclosed herein are within the scope of the present teachings as are methods of making the same. The present compounds can offer processing and operation advantages in the fabrication and/or the use of these devices.

For example, articles of manufacture such as the various devices described herein can be an electronic or optoelectronic device including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., as described in U.S. Pat. No. 7,678,463, the entire disclosure of which is incorporated by reference herein). In some embodiments, the dielectric component can include the crosslinked polymer blends described in U.S. Pat. No. 7,605,394, the entire disclosure of which is incorporated by reference herein. The composite also can include one or more electrical contacts/electrodes. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene)poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

FIG. 1 illustrates the four common types of OFET structures: (top left) bottom-gate top-contact structure, (top right) bottom-gate bottom-contact structure, (bottom left) top-gate bottom-contact structure, and (bottom right) top-gate top-contact structure. As shown in FIG. 1, an OFET can include a gate dielectric component (e.g., shown as 8, 8', 8", and 8'''), a semiconducting component or semiconductor layer (e.g., shown as 6, 6', 6", and 6'''), a gate electrode or contact (e.g., shown as 10, 10', 10", and 10'''), a substrate (e.g., shown as 12, 12', 12", and 12'''), and source and drain electrodes or contacts (e.g., shown as 2, 2', 2", 2''', 4, 4', 4", and 4'''). As shown, in each of the configurations, the semiconducting component is in contact with the source and drain electrodes and the gate dielectric component.

In certain embodiments, OTFT devices can be fabricated with the present compounds on doped silicon substrates, using SiO$_2$ as the dielectric, in top-contact geometries. In particular embodiments, the active semiconductor layer which incorporates at least a compound of the present teachings can be deposited at room temperature or at an elevated temperature. In other embodiments, the active semiconductor layer which incorporates at least one compound of the present teachings can be applied by spin-coating or printing as described herein. For top-contact devices, metallic contacts can be patterned on top of the films using shadow masks.

In certain embodiments, OTFT devices can be fabricated with the present compounds on plastic foils, using polymers as the dielectric, in top-gate bottom-contact geometries. In particular embodiments, the active semiconducting layer which incorporates at least a compound of the present teachings can be deposited at room temperature or at an elevated temperature. In other embodiments, the active semiconducting layer which incorporates at least a compound of the present teachings can be applied by spin-coating or printing as described herein. Gate and source/drain contacts can be made of Au, other metals, or conducting polymers and deposited by vapor-deposition and/or printing.

In various embodiments, a semiconducting component incorporating compounds of the present teachings can exhibit p-type semiconducting activity, for example, a hole mobility of $10^{-4}$ cm$^2$/V-sec or greater and/or a current on/off ratio ($I_{on}/I_{off}$) of $10^3$ or greater.

Other articles of manufacture in which compounds of the present teachings are useful are photovoltaics or solar cells. Compounds of the present teachings can exhibit broad optical absorption and/or a tuned redox properties and bulk carrier mobilities, making them desirable for such applications. Accordingly, the compounds described herein can be used as a donor (p-type) semiconductor material in a photovoltaic design, which includes an adjacent n-type semiconductor material that forms a p-n junction. The compounds can be in the form of a thin film semiconductor, which can be deposited on a substrate to form a composite. Exploitation of compounds of the present teachings in such devices is within the knowledge of a skilled artisan.

Figure 2:
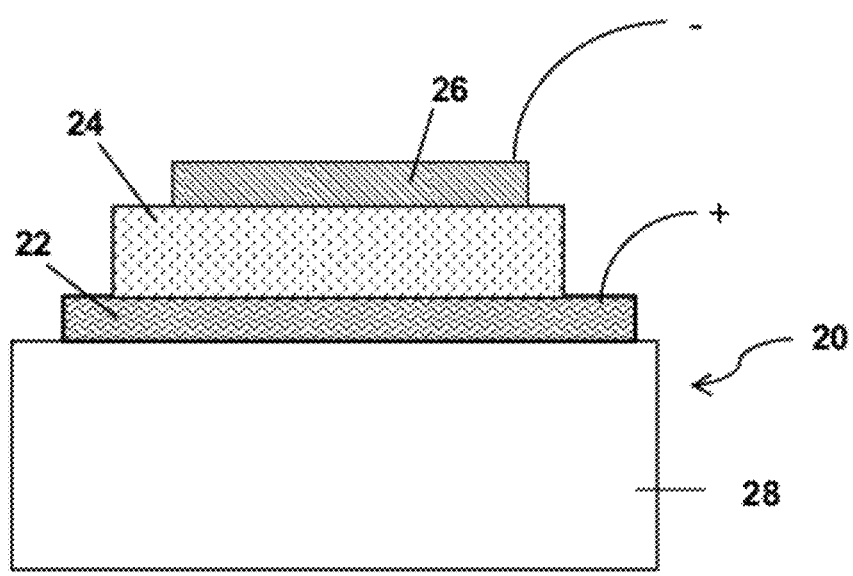
FIG. 2 illustrates a representative structure of a bulk-heterojunction organic photovoltaic device (also known as solar cell) which can incorporate one or more compounds of the present teachings as the donor and/or acceptor materials.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 2 illustrates a representative structure of a bulk-heterojunction organic photovoltaic device (also known as solar cell) which can incorporate one or more compounds of the present teachings as the donor and/or acceptor materials. As shown, a representative solar cell generally includes a substrate 20 (e.g., glass), an anode 22 (e.g., ITO), a cathode 26 (e.g., aluminium or calcium), and a photoactive layer 24 between the anode and the cathode which can incorporate one or more compounds of the present teachings as the electron donor (p-channel) and/or electron acceptor (n-channel) materials. For example, the photoactive layer can be composed of a blend film including a polymer according to the present teachings as the "donor" material and a fullerene-based compound as the "acceptor" material. Typical fullerenes include C60 or C70 "bucky ball" compounds functionalized with solubilizing side chains, such as C60 [6,6]-phenyl-C61-butyric acid methyl ester (C$_{60}$PCBM) or C$_{70}$PCBM.

Figure 3:
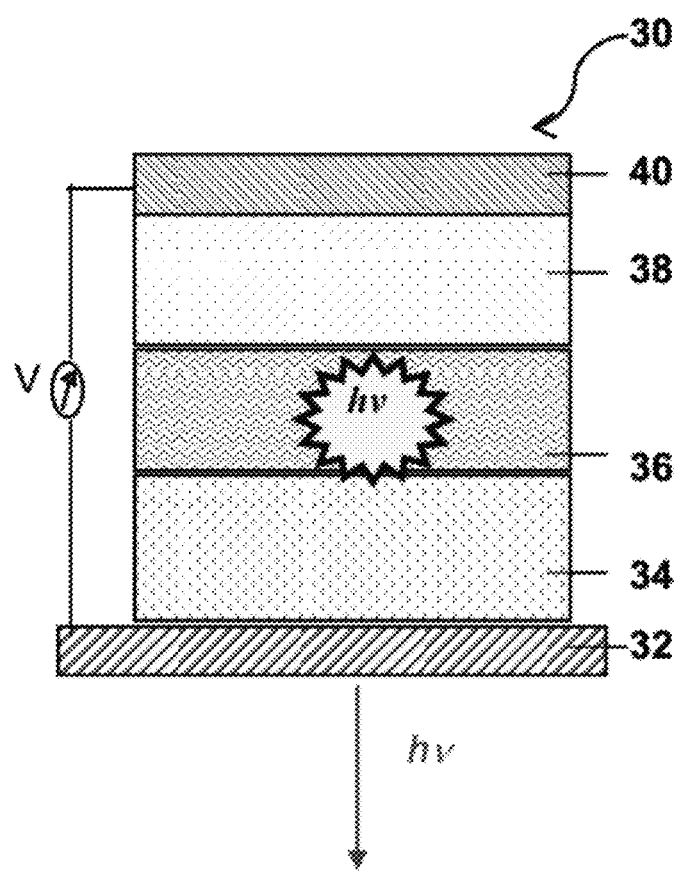
FIG. 3 illustrates a representative structure of an organic light-emitting device which can incorporate one or more compounds of the present teachings as electron-transporting and/or emissive and/or hole-transporting materials.
Figure 4:
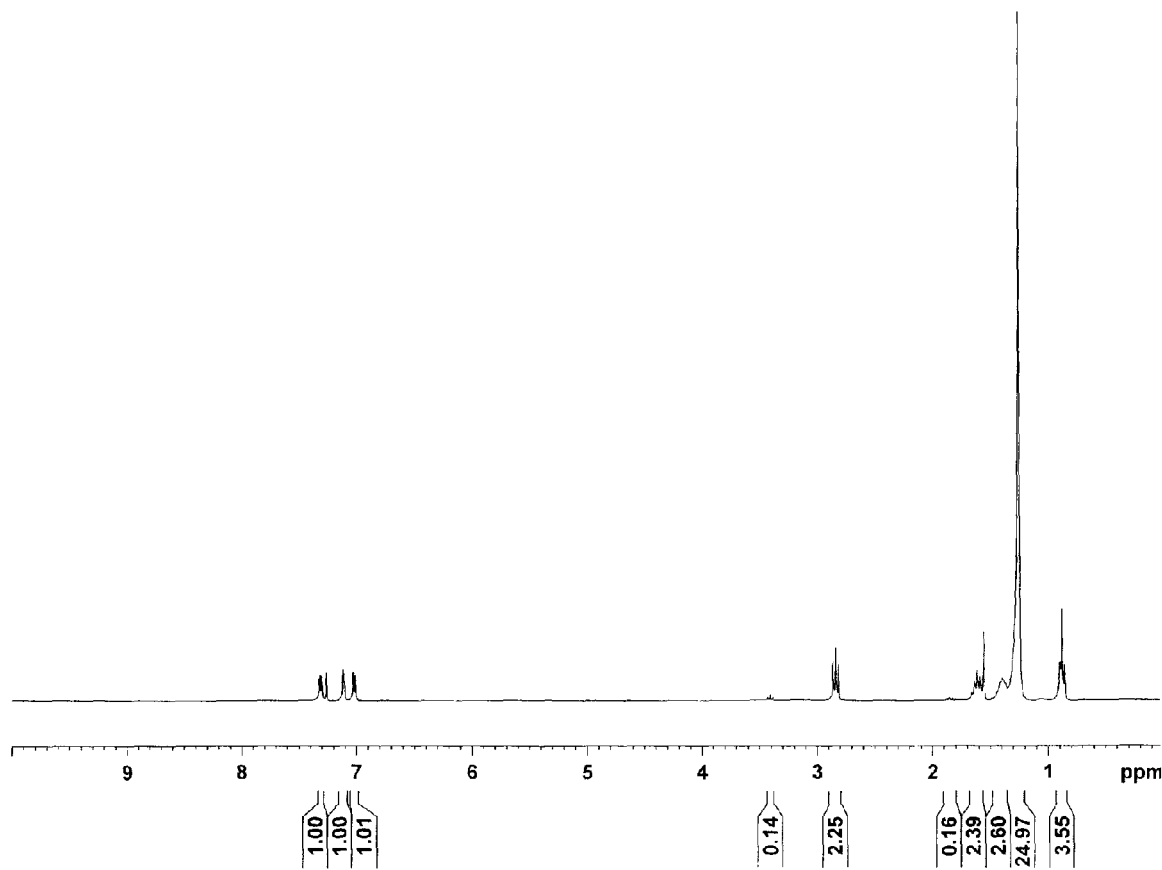
FIG. 4 shows a $^1$H NMR (CDCl$_3$) spectrum of 3-tetradecylthiothiophene (1).
Figure 5:
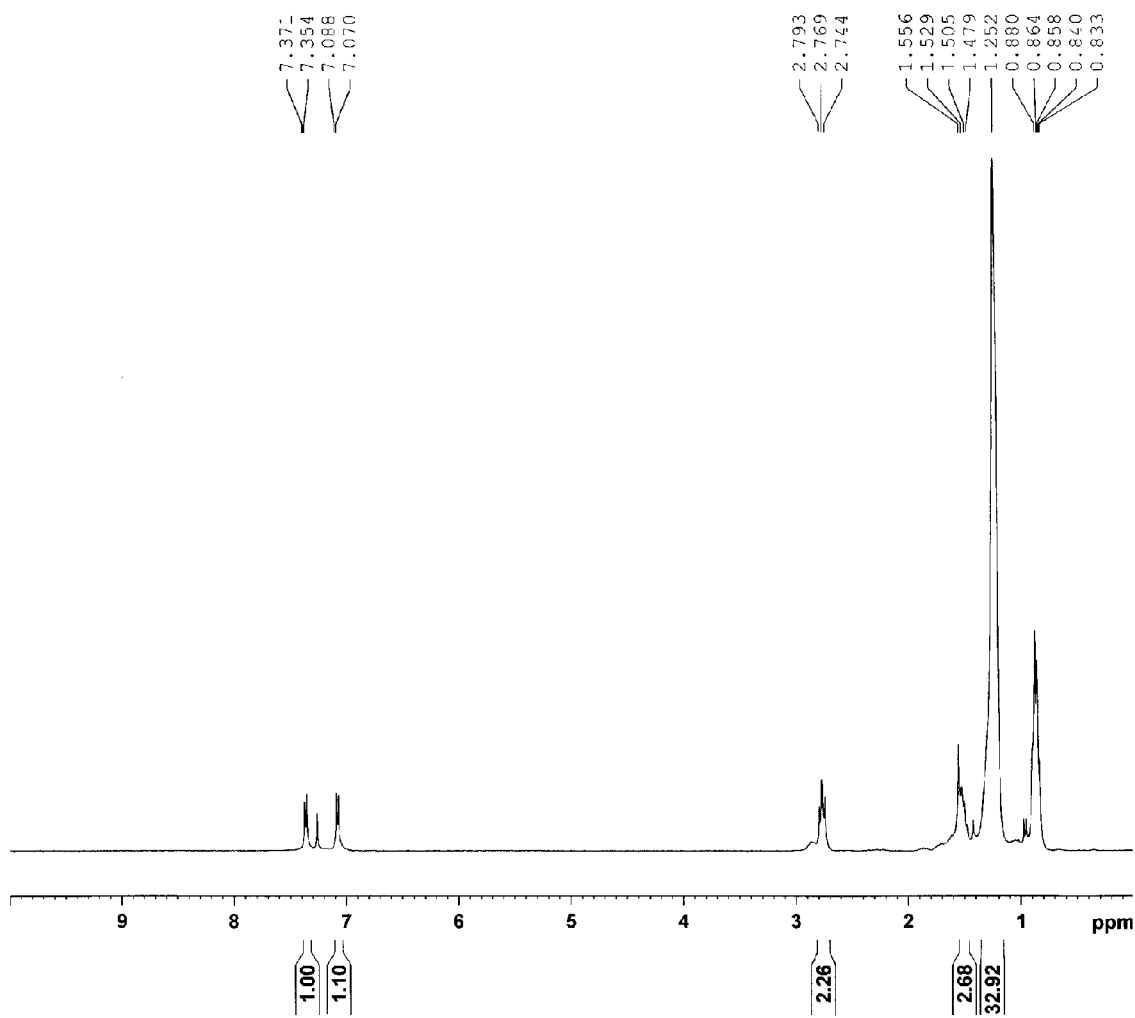
FIG. 5 shows a $^1$H NMR (CDCl$_3$) spectrum of 3,3'-bis(tetradecylthio)-2,2'-bithiophene (2).
Figure 6:
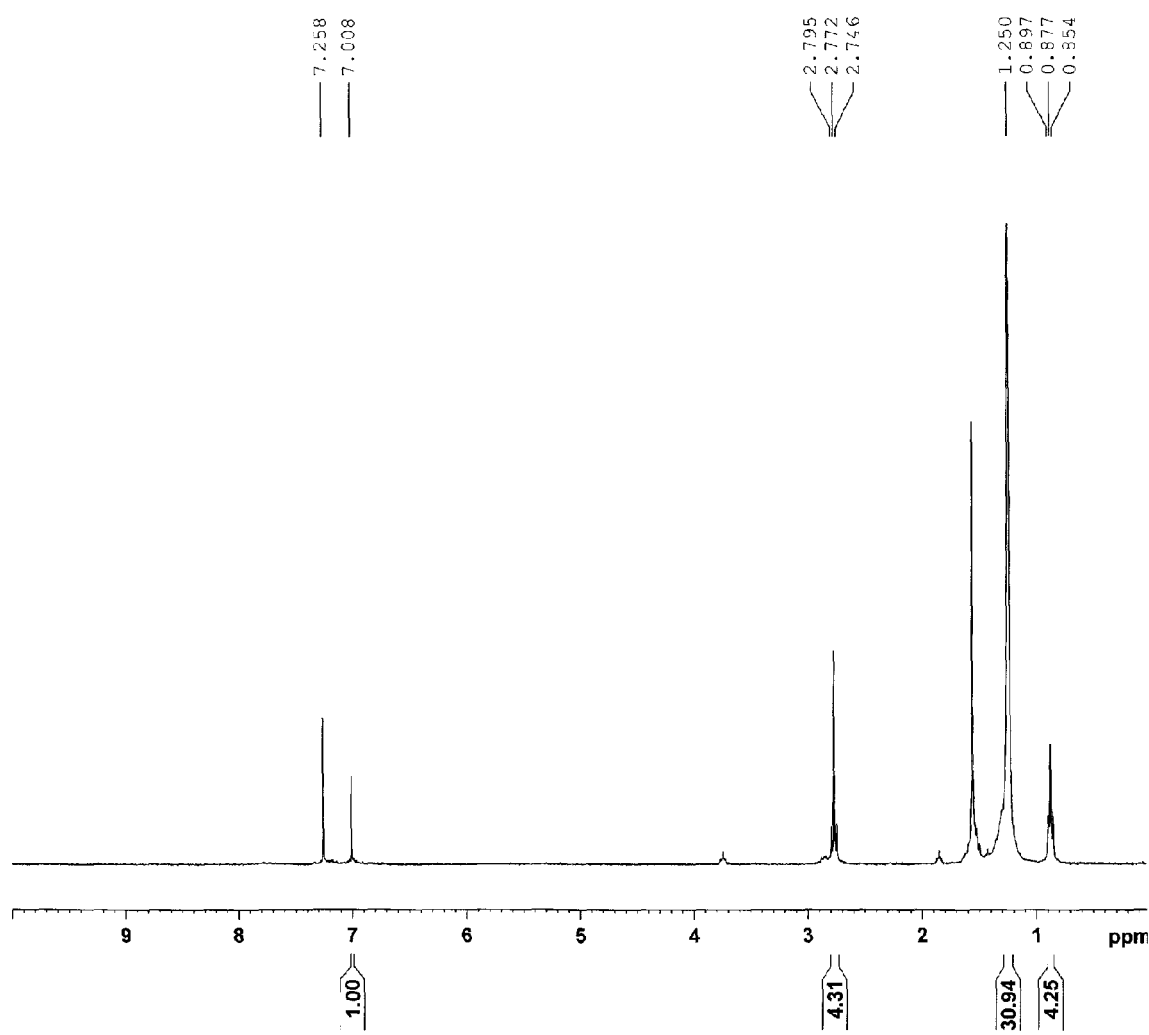
FIG. 6 shows a $^1$H NMR (CDCl$_3$) spectrum of 5,5'-dibromo-3,3'-bis(tetradecylthio)-2,2'-bithiophene (3).
Figure 7:
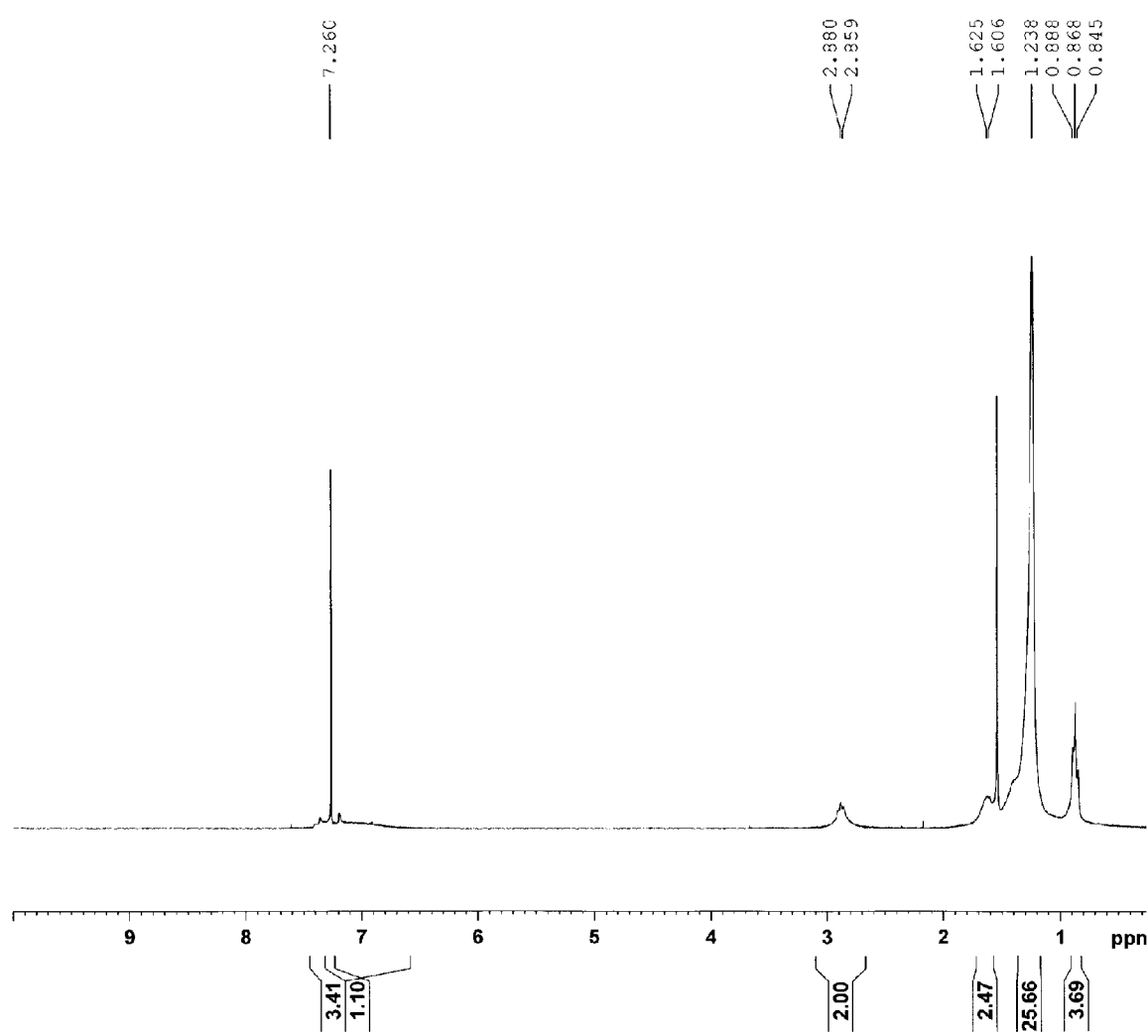
FIG. 7 shows a $^1$H NMR (CDCl$_3$) spectrum of poly(thieno[3,2-b]thiophene-2-yl-3,3'-bis(tetradecylthio)-2,2'-bithiophene (POL-5).
Figure 8:
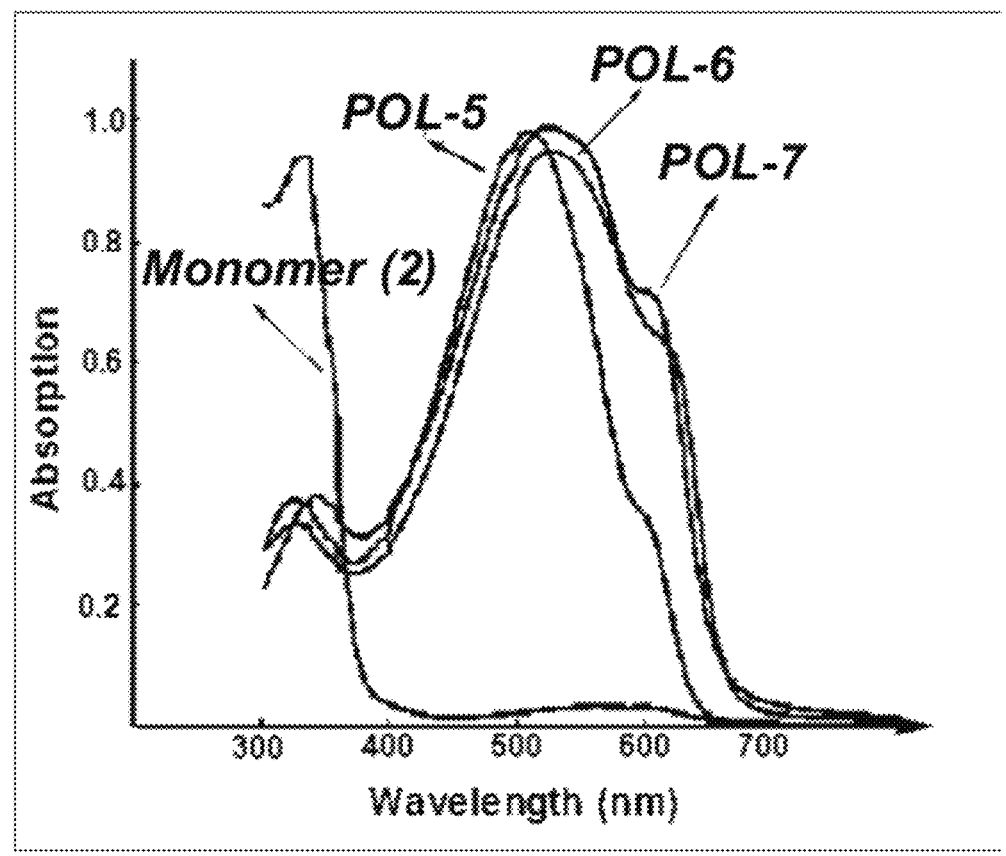
FIG. 8 shows an optical absorption spectrum of selected polymers and compound 2.

FIG. 3 illustrates a representative structure of an OLED which can incorporate one or more compounds of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more compounds of the present teachings as hole-transporting (n-channel) (layer 34 as shown) and/or emissive (layer 36 as shown) and/or electron-transporting (p-channel) materials (layer 38 as shown). In embodiments where the present compounds only have one or two of the properties of hole transport, electron transport, and emission, the present compounds can be blended with one or more further organic compounds having the remaining required property or properties.

The following examples are provided to illustrate further and to facilitate the understanding of the present teachings and are not in any way intended to limit the invention.

EXAMPLE 1

Synthesis of 3,3'-bis(tetradecylthio)-2,2'-bithiophene

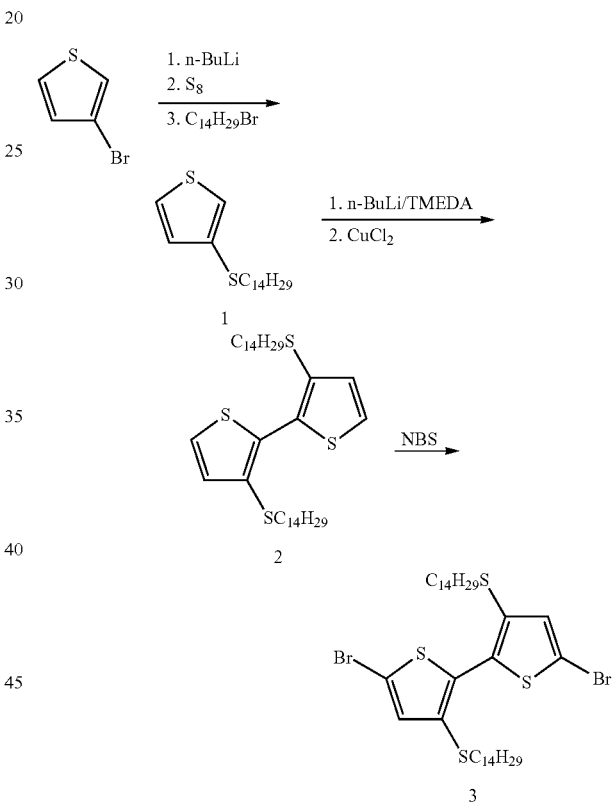

EXAMPLE 1A

Synthesis of 3-tetradecylthiothiophene (1)

Under nitrogen at −78° C., 2.5 M n-BuLi (40 mL in hexanes, 0.1 mol) was slowly added into an ether solution (30 mL) of 3-bromothiophene (10 mL, 0.1 mol) and the mixture was stirred for 40 minutes at this temperature. This solution was then warmed to 0° C. under vacuum to remove C$_4$H$_9$Br and ether (30 mL) was reloaded. At −78° C., sulfur (3.1 g, 0.1 mol) was added into this ether solution, stirred for 30 minutes, then warmed to 0° C. and stirred for another 30 minutes. 1-Bromotetradecane (29.8 mL, 0.1 mol) was added into this solution at −78° C., stirred for 30 minutes, then warmed up to room temperature and stirred overnight. HCl (0.5N, 100 mL) was added and the organic ether portion was collected. Solvent was removed and the desired product was then further purified by distillation (CaH$_2$ as the drying reagent), giving a yellow oil (22.8 g; yield 73%). $^1$H NMR (300 Hz; CDCl$_3$): δ 7.31 (dd, J=3 Hz, J=5.1 Hz, 1H), 7.1 (dd, J=3 Hz, J=1.2 Hz, 1H), 7.02 (dd, J=1.2 Hz, J=4.8 Hz, 1H), 2.84 (t, J=7.5 Hz, 2H), 1.85 (t, J=7.1 Hz, 2H), 1.39 (t, J=6.8 Hz, 2H), 1.26 (br, 20H), 0.88 (t, J=6.6 Hz, 3H).

EXAMPLE 1B

Synthesis of 3,3'-bis(tetradecylthio)-2,2'-bithiophene (2)

At 0° C., 2.5 M n-BuLi (14 mL in hexanes, 0.035 mol) and TMEDA (5.3 mL, 0.035 mol) were slowly added into the alkylthiothiophene (10 g, 0.032 mol). The mixture was stirred for 30 minutes, and then heated to reflux for 1 hour. CuCl$_2$ (5.31 g, 0.040 mol) was added into this mixture at −78° C., stirred for 40 minutes, then warmed to room temperature and stirred overnight. HCl (0.5N, 100 mL) was added and the organic ether portion was collected. Solvent was removed and the desired product was then further purified by chromatography (silica gel; hexanes/CH$_2$Cl$_2$=95:5 as the eluent), giving a yellow solid (2.79 g; yield 14%). $^1$H NMR (CDCl$_3$): δ 7.36 (d, J=5.1 Hz, 2H), 7.08 (d, J=5.4 Hz, 2H), 2.77 (t, J=7.4 Hz, 4H), 1.53 (m, 4H), 1.25 (br, 44H), 0.86 (t, J=6.6 Hz, 6H).

EXAMPLE 1C

Synthesis of 5,5'-dibromo-3,3'-bis(tetradecylthio)-2,2'-bithiophene (3)

At 0° C., NBS (0.3 g, 1.7 mmol) was added to a THF solution (40 mL) of 3,3'-bis(tetradecylthio)-2,2'-bithiophene (1.0 g, 1.7 mmol), and the mixture was then warmed to room temperature and stirred overnight. THF was removed and then water as well as CH$_2$Cl$_2$ were added, after which the organic portion was collected. The desired product was purified by recrystallization, giving a yellow solid (1.1 g; yield 93%). $^1$H NMR (CDCl$_3$): δ 7.01 (s, 2H), 2.77 (t, J=3.6 Hz, 4H), 1.57 (m, 4H), 1.25 (br, 44H), 0.88 (t, J=6.5 Hz, 6H).

EXAMPLE 2

Synthesis of the Polymers

EXAMPLE 2A

Preparation of POL-1

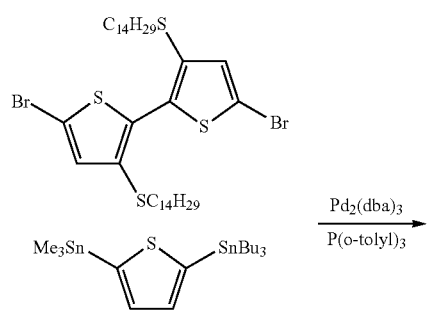

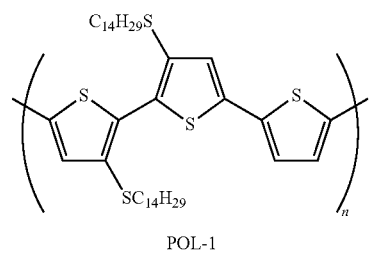

POL-1

A mixture of 5,5'-dibromo-3,3'-bis(tetradecylthio)-2,2'-bithiophene (0.3 g, 0.38 mmol), a stannyl derivative of thiophene (0.38 mmol), tri(o-tolyl)phosphine (9.5 mg, 8 mol %), and tris(dibenzylideneacetone)dipalladium (7.0 mg, 2 mol %) in THF (10 mL) was stirred at 110° C. for 12 hours. The mixture was cooled to room temperature and quenched with 15 mL of methanol, and filtered. The product was collected by filtration resulting in a red solid (59% yield).

EXAMPLE 2B

Preparation of POL-2

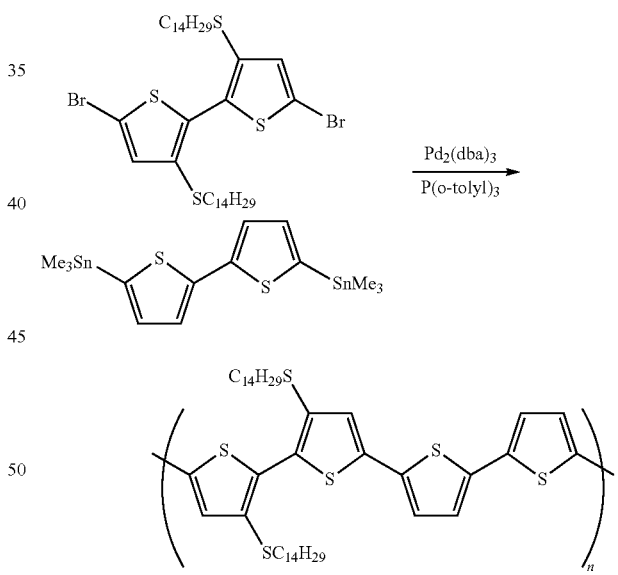

POL-2

A mixture of 5,5'-dibromo-3,3'-bis(tetradecylthio)-2,2'-bithiophene (0.3 g, 0.38 mmol), a stannyl derivative of bithiophene (0.38 mmol), tri(o-tolyl)phosphine (9.5 mg, 8 mol %), and tris(dibenzylideneacetone)dipalladium (7.0 mg, 2 mol %) in THF (10 mL) was stirred at 110° C. for 10 hours. The mixture was cooled to room temperature and quenched with 15 mL of methanol, and filtered. The product was collected by filtration resulting in a red solid (52% yield).

EXAMPLE 2C

Preparation of POL-3

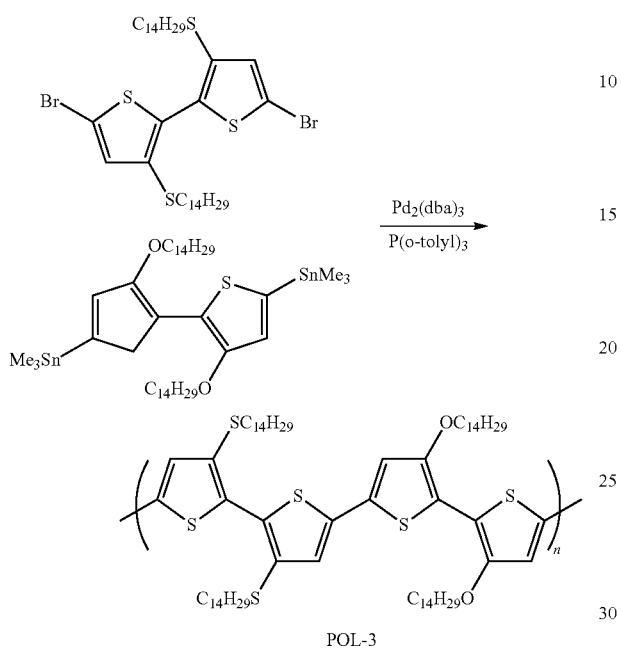

POL-3

A mixture of 42.6 mg (0.0546 mmol) of 5,5'-dibromo-3,3'-bis(tetradecylthio)-2,2'-bithiophene, 50.0 mg (0.0545 mmol) of a stannyl derivative of 3,3'-bis(tetradecyloxy)-2,2'-bithiophene, 1.5 mg (0.0016 mmol) of $Pd_2(dba)_3$, and 4.0 mg (0.013 mmol) of $P(o\text{-tolyl})_3$ in 4 mL of tetrahydrofuran was stirred at 80° C. for 15 hours. The mixture was cooled to room temperature, treated with 10 mL of methanol, and filtered. The solid was subjected to soxhlet extraction with methanol, acetone, hexane, and then chloroform. The chloroform extract was treated with methanol and filtered. The filter cake was dried to the title polymer as a deep purple solid (30 mg, 45% yield).

EXAMPLE 2D

Preparation of POL-4

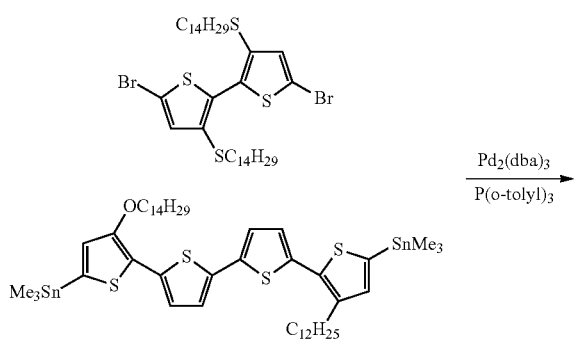

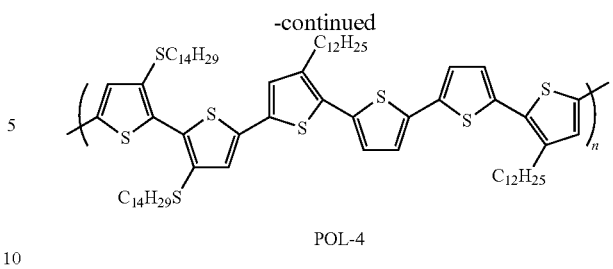

POL-4

Under nitrogen, a mixture of 5,5'-dibromo-3,3'-bis(tetradecylthio)-2,2'-bithiophene (0.6 g, 0.76 mmol), 5,5'-bis(3-dodecyl-5-(trimethylstannyl)thiophen-2-yl)-2,2'-bithiophene (0.76 mmol), tri(o-tolyl)phosphine (20 mg), and tris(dibenzylideneacetone)dipalladium (14 mg) in THF (20 mL) was stirred at 110° C. for 24 hours. The mixture was cooled to room temperature and quenched with 25 mL of methanol, and filtered. The product was collected by filtration resulting in a dark red solid (43% yield).

EXAMPLE 2E

Preparation of POL-5

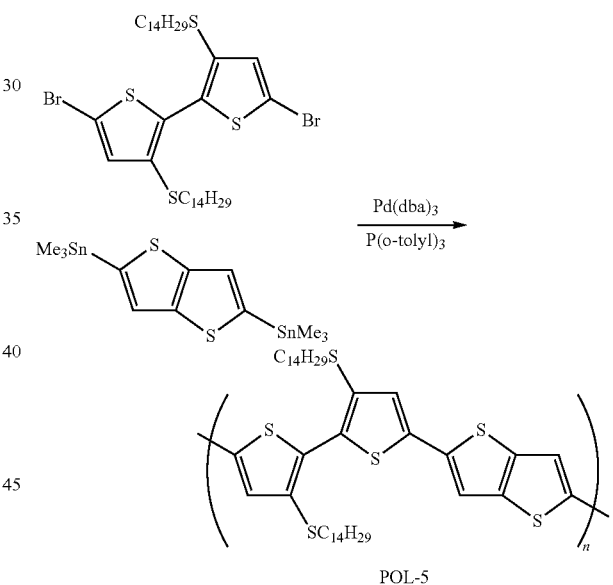

POL-5

Under nitrogen and anhydrous conditions, a chlorobenzene solution (30 mL) of 5,5'-dibromo-3,3'-bis(tetradecylthio)-2,2'-bithiophene (0.3 g, 0.38 mmol), 2,5-bis(trimethylstannyl)thieno[3,2-b]thiophene (7) (0.179 g, 0.38 mmol), tri(o-tolyl)phosphine (9.4 mg, 8 mol %), and tris(dibenzylideneacetone)dipalladium (7.04 mg, 2 mol %) was stirred at 110° C. for 12 minutes. Polymerization was quenched by addition of HCl (12 M; 2 mL)/methanol (50 mL) and the desired polymeric product was precipitated out immediately and was collected by filtration. The solid was then extracted using a soxlet setup with hexanes and then methanol, respectively, for 24 hours. Furthermore, the polymer was purified by flash chromatography (silica gel; hot o-xylene (~120° C.) as the eluent) and then recrystallized from this o-xylene solution by addition of 100 mL methanol to give a purple red solid (0.24 g; yield ~80%). $^1$H NMR (300 MHz; $CDCl_3$): δ 7.26 (br, 4H), 2.86 (br, 4H), 1.77 (br, 4H), 1.26 (br, 44H), 0.88 (br, 6H).

EXAMPLE 2F

Preparation of POL-6

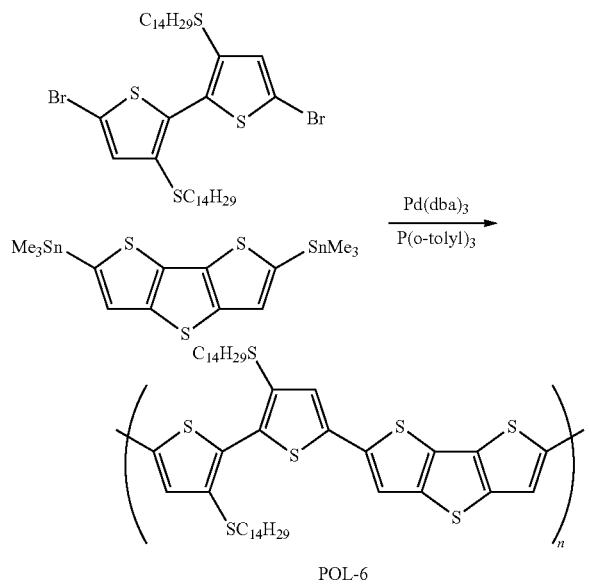

POL-6

Using procedures analogous to those described in Example 2E but replacing 2,5-bis(trimethylstannyl)thieno[3,2-b]thiophene with 2,6-bis(trimethylstanyl)dithieno[3,2-b;2',3'-c/]thiophene (0.201 g, 0.38 mmol), POL-6 was obtained as a purple red solid in yields of ~80%.

EXAMPLE 2G

Preparation of POL-7

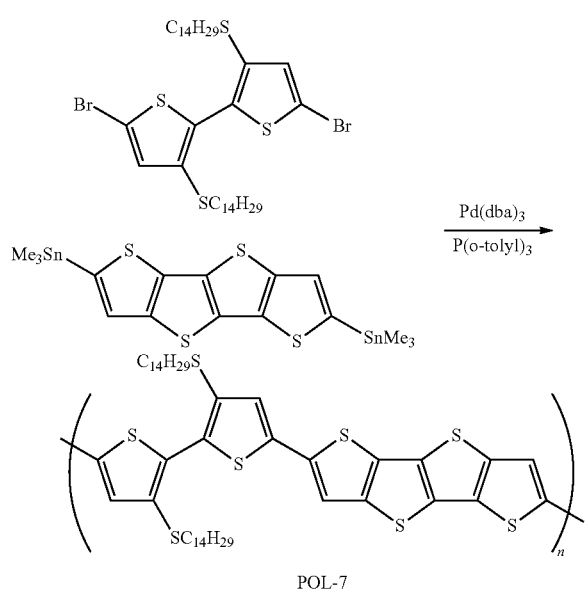

POL-7

Using procedures analogous to those described in Example 2E but replacing 2,5-bis(trimethylstannyl)thieno[3,2-b]thiophene with 2,6-bis(trimethylstannyl)tetrathienoacene (0.222 g, 0.38 mmol), POL-7 was obtained as a purple red solid in yields of ~80%.

EXAMPLE 2H

Preparation of POL-8

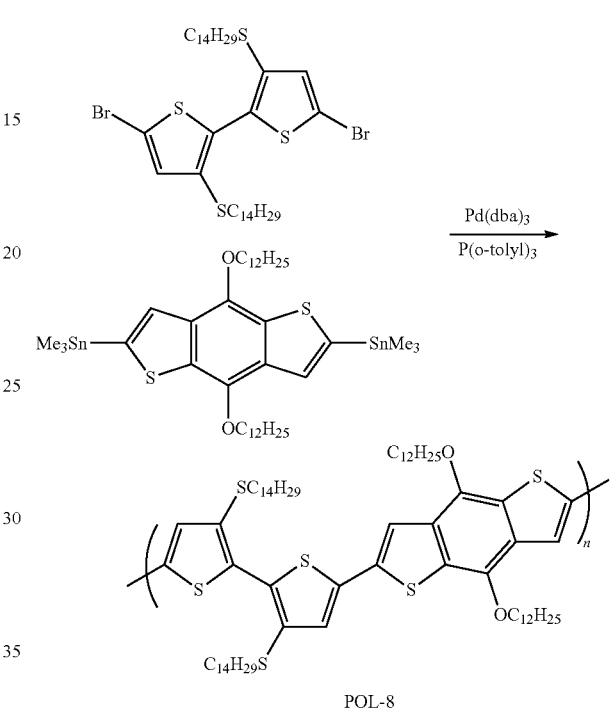

POL-8

A mixture of 44.1 mg (0.0565 mmol) of 5,5'-dibromo-3,3'-bis(tetradecylthio)-2,2'-bithiophene, 50.0 mg (0.0565 mmol) of 4,8-bis-(dodecyloxy)-2,6-bis-trimethylstannyl-benzo[1,2-b:4,5-b']dithiophene, 1.6 mg (0.0017 mmol) of Pd$_2$(dba)$_3$, and 4.3 mg (0.014 mmol) of P(o-tolyl)$_3$ in 4 mL of tetrahydrofuran was stirred at 80° C. for 15 hours. The mixture was cooled to room temperature, treated with 10 mL of methanol, and filtered. The solid was subjected to soxhlet extraction with methanol, acetone, hexane, and then chloroform. The chloroform extract was treated with methanol and filtered. The filter cake was dried to give the title polymer as a deep red solid (25 mg, 38% yield).

EXAMPLE 2I

Preparation of POL-9

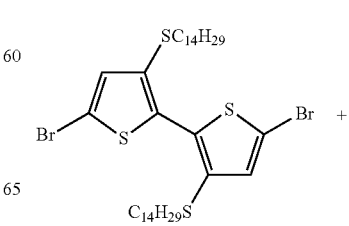

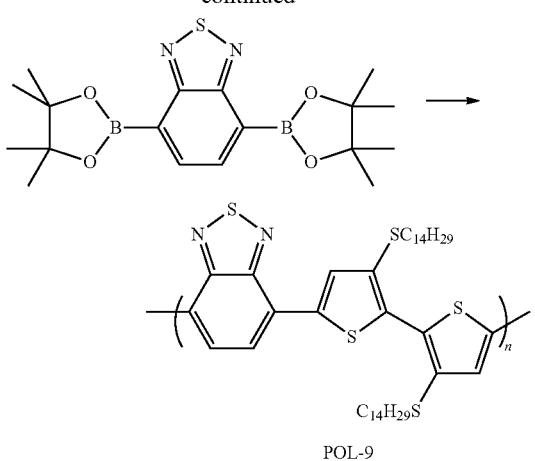

POL-9

A mixture of 60 mg (0.0768 mmol) of 5,5'-dibromo-3,3'-bis(tetradecylthio)-2,2'-bithiophene, 29.8 mg (0.0768 mmol) of 4,7-bis(4,4,5,5-tetramethyl-1,3,2-dioxaborolan-2-yl)benzo[c][1,2,5]thiadiazole (Aldrich), 2.1 mg (0.0023 mmol) of Pd$_2$(dba)$_3$, and 5.6 mg (0.018 mmol) of P(o-tolyl)$_3$ in 2 mL of toluene was stirred for 5 minutes at room temperature and treated with 1 drop (ca. 10 mg) of ALIQUAT® 336 and 195 mg (0.6 mmol) of Cs$_2$CO$_3$ in 2 mL of degassed water. The mixture was stirred at 105° C. for 40 hours, cooled to room temperature, treated with 10 mL of methanol, and filtered. The solid was washed with water and methanol then subjected to soxhlet extraction with methanol, acetone, hexanes, and chloroform. The chloroform extract was precipitated with methanol and the solid was collected by filtration to give 46 mg (79% yield) of the title polymer as a blue-green solid.

EXAMPLE 3

Device Fabrication

Figure 9:
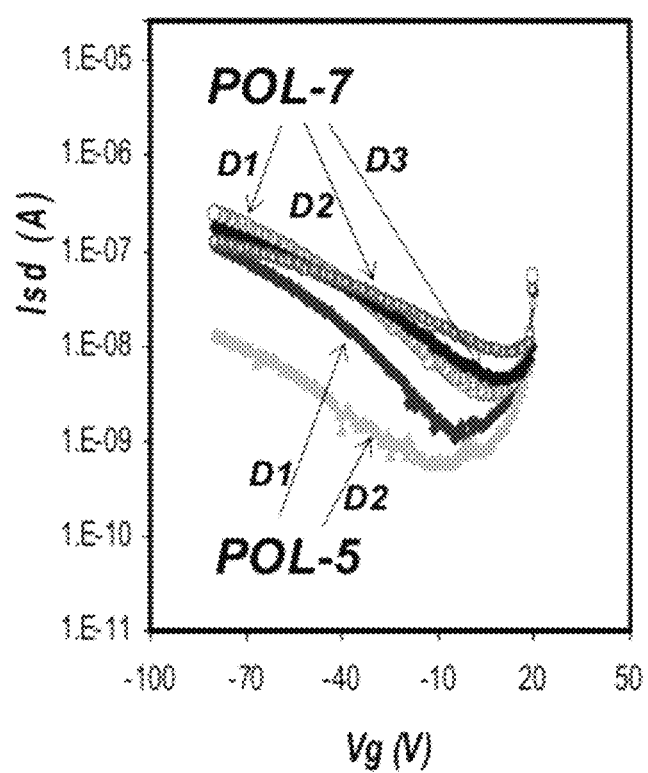
FIG. 9 shows transfer plots of field-effect transistors incorporating a polymer according to the present teachings as the semiconductor layer (POL-5 and POL-7) and an organic dielectric layer (D1=PMMA, D2=CYTOP, D3=PS).

Top-gate bottom contact TFTs were fabricated using compounds of the present teachings as the semiconductor layer. Au source-drain contacts (channel lengths 20-100 microns, channel widths 500-5000 microns) were fabricated on glass or plastic substrates. A solution of the polymeric semiconductor (3-20 mg/mL) in an organic solvent such as dichlorobenzene, chlorobenzene, or toluene was spin-coated on these substrates affording 20-150 nm thick films. These films were optionally annealed at 100-200° C. from 5 minutes to 12 hours. Next, the gate dielectric material (e.g., poly(methylmethacrylate) (PMMA), CYTOP®, polystyrene (PS), poly (p-tert-butylstyrene) (PtBS), or ActivInk™ D1400 or D2200 (both available from Polyera Corp., Skokie Ill.) was deposited by spin-coating affording films of thicknesses from 300 nanometer to 5 microns. The TFTs were completed by vapor deposition of 30 nm thick metal (gold, silver, aluminum) gate contacts. Mobility of 0.01-0.1 cm$^2$/Vs was Obtained for POL-7 with threshold voltage of −10-−30 V, and on-off etuTent ratio of Representative transfer plots (current vs. gate voltage) of bottom-contact top-gate devices incorporating POL-5 and POL-7, respectively, are shown in FIG. 9.

Table 1 summarizes certain physical properties of POL-5, POL-6, and POL-7.

TABLE 1

| | UV-Vis$^a$ | E$_{gap}$ (eV) | | DPV | |
|---|---|---|---|---|---|
| | λ$_{max}$ (nm) | (UV) | (DPV)$^b$ | (HOMO)$^b$ | (LUMO)$^b$ |
| POL-5 | 511 | 1.93 | 2.21 | −5.20 | −2.98 |
| POL-6 | 528 | 1.83 | 2.35 | −5.55 | −3.20 |
| POL-7 | 525 | 1.80 | 2.06 | −5.42 | −3.36 |

$^a$in o-C$_6$H$_4$Cl$_2$.
$^b$in o-C$_6$H$_4$Cl$_2$ at 100° C.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electronic, optical or optoelectronic device comprising a polymeric semiconductor component, wherein the polymeric semiconductor component comprises a polymer comprising a repeating unit of formula (I):

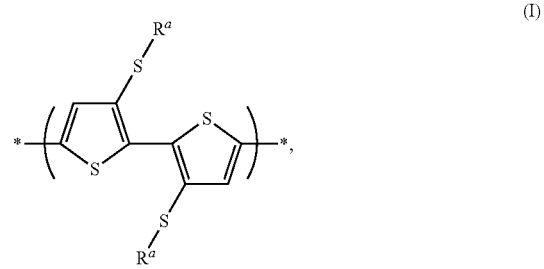

wherein R$^a$ is a linear C$_{1-40}$ alkyl or haloalkyl group or a branched C$_{3-40}$ alkyl or haloalkyl group, provided that at least one of R$^a$ is selected from

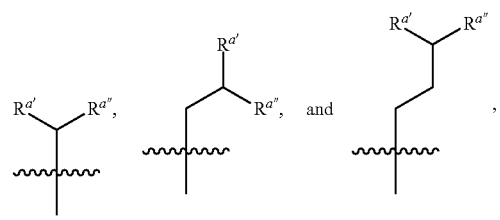

wherein R$^{a\prime}$ and R$^{a\prime\prime\prime}$, independently are a linear C$_{1-20}$ alkyl or haloalkyl group; and
wherein the polymer has an average molecular weight in the range of about 3,000 to about 300,000.

2. The device of claim 1, wherein the polymer comprises at least one other repeating unit that is different from the repeating unit of formula (I).

3. The device of claim 2, wherein the polymer comprises at least one other repeating unit, the other repeating unit comprising an optionally substituted polycyclic 8-14 membered heteroaryl group, the optionally substituted polycyclic 8-14 membered heteroaryl group comprising at least one sulfur atom.

4. The device of claim 1, wherein the polymer further comprises a repeating unit of formula (VI), (VII), (VIII) or (IX):

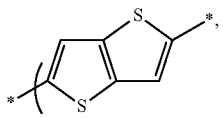
(VI)

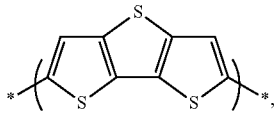
(VII)

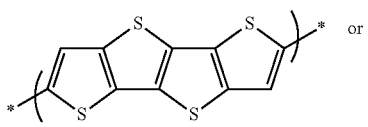
(VIII)

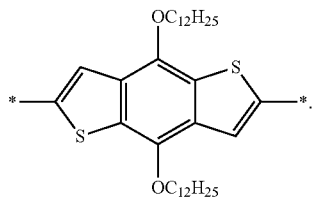
(IX)

5. The device of claim 2, wherein the polymer is an alternating copolymer.

6. The device of claim 1, wherein the polymer has a degree of polymerization between 5 and 5,000.

7. The device of claim 1 configured as a thin film transistor comprising a substrate, a source electrode, a drain electrode, a gate electrode, a gate dielectric component, and the polymeric semiconductor component in contact with the source electrode and the drain electrode, wherein the gate dielectric component is in contact with the semiconductor component on one side and the gate electrode on an opposite side.

* * * * *